US006552779B2

(12) United States Patent
Mei

(10) Patent No.: US 6,552,779 B2
(45) Date of Patent: Apr. 22, 2003

(54) FLYING IMAGE OF A MASKLESS EXPOSURE SYSTEM

(75) Inventor: Wenhui Mei, Plano, TX (US)

(73) Assignee: Ball Semiconductor, Inc., Allen, TX (US)

(*) Notice: Subject to any disclaimer, the term of this patent is extended or adjusted under 35 U.S.C. 154(b) by 32 days.

(21) Appl. No.: 09/863,557

(22) Filed: May 23, 2001

(65) Prior Publication Data

US 2001/0048515 A1 Dec. 6, 2001

Related U.S. Application Data

(60) Provisional application No. 60/207,039, filed on May 25, 2000.

(51) Int. Cl.[7] .................. G03B 27/72; G03B 27/42; G03F 9/00

(52) U.S. Cl. ............ 355/71; 355/53; 347/239; 347/241; 430/5; 430/22

(58) Field of Search .................. 355/53, 67, 71; 430/5, 22, 30, 311, 322; 347/239, 255, 241; 250/492.1, 492.2; 353/30, 122

(56) References Cited

U.S. PATENT DOCUMENTS

| 5,079,544 A | * | 1/1992 | DeMond et al. ............. 345/600 |
| 5,281,996 A | | 1/1994 | Bruning et al. ............... 355/77 |
| 5,416,729 A | | 5/1995 | Leon et al. ................... 364/578 |
| 5,431,127 A | | 7/1995 | Stevens et al. ............... 117/75 |
| 5,453,814 A | | 9/1995 | Aiyer ........................... 355/70 |
| 5,461,455 A | | 10/1995 | Coteus et al. ................. 355/43 |
| 5,691,541 A | | 11/1997 | Ceglio et al. ............. 250/492.1 |
| 5,870,176 A | | 2/1999 | Sweatt et al. ................. 355/53 |
| 5,900,637 A | | 5/1999 | Smith .................... 250/492.22 |
| 5,909,658 A | | 6/1999 | Clarke et al. ............... 702/126 |
| 5,949,557 A | | 9/1999 | Powell .......................... 359/8 |
| 5,955,776 A | | 9/1999 | Ishikawa .................... 257/618 |
| 5,998,069 A | | 12/1999 | Cutter et al. .................... 430/5 |
| 6,031,561 A | * | 2/2000 | Narayan et al. ............. 347/115 |
| 6,037,967 A | * | 3/2000 | Allen et al. ................. 347/239 |
| 6,052,517 A | | 4/2000 | Matsunaga et al. ..... 395/500.09 |
| 6,081,381 A | | 6/2000 | Shalapenok et al. ......... 359/619 |
| 6,084,656 A | | 7/2000 | Choi et al. ..................... 355/71 |

(List continued on next page.)

FOREIGN PATENT DOCUMENTS

EP 0552953 7/1993 ............. G03F/7/20

OTHER PUBLICATIONS

"New Multi–EB Direct Write Concept for Maskless High Throughput", Canon SubMicron Focus, vol. 5, Summer 2000.

Sandstrom and Odselius, "Large–Area High Quality Photomasks", Micronic Laser Systems, published by SPIE, vol. 2621, 1985, pp. 312–318.

Singh–Gasson, Sangeet et al., Maskless Fabrication of Light–Directed Oligonucleotide Microarrays Using a Digital Micromirror Array, vol. 17, No. 10, Oct. 1999, pp. 974–978.

Devitt, Terry, "Advanced May Put Gene Chip Technology on Scientists Desktops", http://www.biotech.wise.edu/Education/biotechnews/GeneChip.html, Oct. 7, 1999.

Primary Examiner—Alan A. Mathews
(74) Attorney, Agent, or Firm—Haynes & Boone, LLP

(57) ABSTRACT

A system for image-scanning a pixel-mask pattern onto a subject, such as a subject in digital photolithography, is provided. The system includes a pixel panel for generating a pixel pattern formed of pixel elements. A lens system positioned between the panel and the subject simultaneously directs the pixel elements to the subject. A mirror positioned between the panel and the subject enables the system to direct the pixel elements to a portion of the subject at any one time. A computing system may be used to generate the pixel elements and provide the pixel elements to the panel in a predetermined sequence.

11 Claims, 3 Drawing Sheets

U.S. PATENT DOCUMENTS

| | | | | |
|---|---|---|---|---|
| 6,133,986 | A | 10/2000 | Johnson | 355/67 |
| 6,154,259 | A | 11/2000 | Hargis et al. | 348/756 |
| 6,200,713 | B1 * | 3/2001 | Agostinelli et al. | 347/233 |
| 6,204,875 | B1 * | 3/2001 | De Loor et al. | 347/239 |
| 6,238,852 | B1 * | 5/2001 | Klosner | 355/46 |
| 6,251,550 | B1 | 6/2001 | Ishikawa | 430/22 |
| 6,261,728 | B1 * | 7/2001 | Lin | 430/30 |
| 6,291,110 | B1 * | 9/2001 | Cooper et al. | 430/5 |
| 6,312,134 | B1 * | 11/2001 | Jain et al. | 355/35 |
| 6,379,867 | B1 * | 4/2002 | Mei et al. | 355/53 |
| 6,425,669 | B1 * | 7/2002 | Mei et al. | 353/122 |

* cited by examiner

FLYING IMAGE OF A MASKLESS EXPOSURE SYSTEM

CROSS REFERENCE

This invention relies on a provisional patent application U.S. Ser. No. 60/207,039 filed on May 25, 2000.

BACKGROUND

The present invention relates generally to lithographic exposure equipment, and more particularly, to a photolithography system and method, such as can be used in the manufacture of semiconductor integrated circuit devices.

In conventional photolithography systems, the photographic equipment requires a mask for printing a pattern onto a subject. The subject may include, for example, a photo resist coated semiconductor substrate for manufacture of integrated circuits, metal substrate for etched lead frame manufacture, conductive plate for printed circuit board manufacture, or the like. A patterned mask or photomask may include, for example, a plurality of lines, structures, or images. During a photolithographic exposure, the subject must be aligned to the mask very accurately using some form of mechanical control and sophisticated alignment mechanism.

U.S. Pat. No. 5,691,541, which is hereby incorporated by reference, describes a maskless, reticle-free lithography system. The system employs a pulsed or strobed eximer laser to reflect light off a programmable digital mirror device (DMD) for projecting a line image onto a substrate. The substrate is mounted on a stage that is projected during the sequence of pulses.

U.S. Pat. No. 4,925,279, which is hereby incorporated by reference, describes a telecentric F-θ lens system that employs a coherent light source (laser) to direct a beam of light through an F-θ lens system and onto a subject. The beam of light scans a line across the subject to produce a resulting image.

The above-two described systems suffer from a very small exposure area with relatively poor resolution. Being line scanning systems, each system requires a relatively large amount of time for the entire surface of the substrate to be exposed. In addition, the coherent light sources (used for lasers) are not only very expensive, but are unreliable.

U.S. Pat. Ser. No. 09/480,796, filed Jan. 10, 2000 and hereby incorporated by reference, discloses a novel system and method for photolithography which projects a moving pixel image onto specific sites of a subject. A "site" may represent a single pixel, or a group of pixels, depending on the embodiment. In one embodiment, the method projects a pixel-mask pattern onto a subject such as a wafer. The method provides a sub-pattern to a pixel panel pattern generator such as a deformable mirror device or a liquid crystal display. The pixel panel provides a plurality of pixel elements corresponding to the sub-pattern that may be projected onto the subject.

Each of the plurality of pixel elements is then simultaneously focused to discrete, non-contiguous portions of the subject. The subject and pixel elements are then moved and the sub-pattern is changed responsive to the movement and responsive to the pixel-mask pattern. As a result, light can be projected into the sub-pattern to create the plurality of pixel elements on the subject, and the pixel elements can be moved and altered, according to the pixel-mask pattern, to create a contiguous image on the subject.

Certain improvements are desired for maskless photolithograph systems in general, such as the above-described systems and methods. For example, it is desirable to have a relatively large exposure area, to provide good redundancy, to use a relatively inexpensive incoherent light source, to provide high light energy efficiency, to provide high productivity and resolution, and to be more flexible and reliable.

SUMMARY

A technical advance is provided by a novel method and system for image-scanning a pixel-mask pattern onto a subject. The system comprises a panel for generating a pattern comprising a plurality of pixel elements and a lens system positioned between the panel and the subject for simultaneously directing the pixel elements to the subject. The system includes a mirror positioned between the panel and the subject for directing the pixel elements to a portion of the subject at any one time and means for moving the mirror to scan the pixel elements across the subject.

In another embodiment, the system includes means for moving the subject to further scan the pattern across the subject. In yet another embodiment, the system includes means for sequentially providing the pixel elements to the panel so that the pixel elements of the pattern can move in conjunction with the movement of the mirror. In still another embodiment, the lens system includes at least one F-θ lens.

DETAILED DESCRIPTION

The present disclosure relates to exposure systems, such as can be used in semiconductor photolithographic processing. It is understood, however, that the following disclosure provides many different embodiments, or examples, for implementing different features of the invention. Specific examples of components and arrangements are described below to simplify the present disclosure. These are, of course, merely examples and are not intended to limit the invention from that described in the claims.

Figure 1:
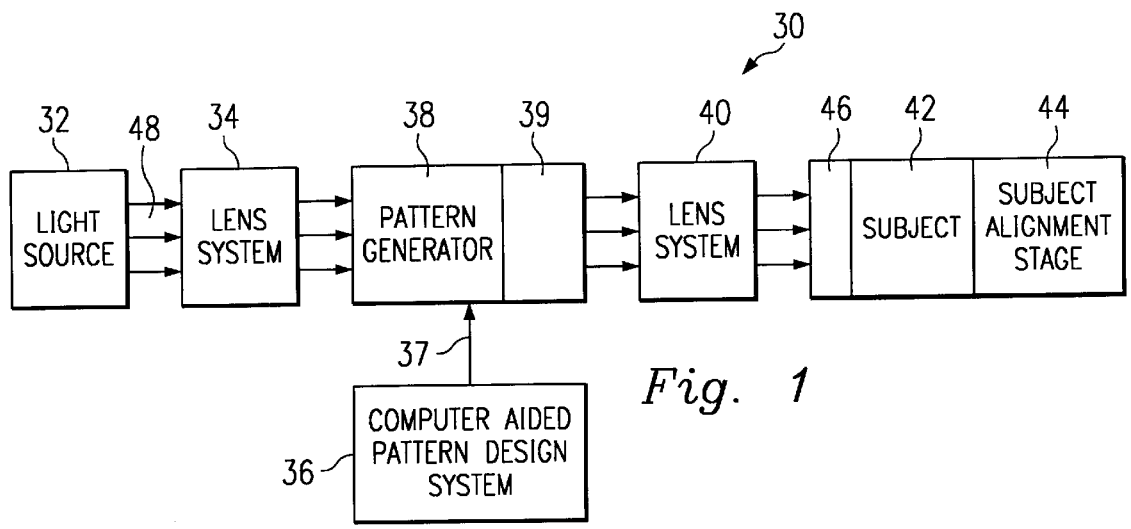
FIG. 1 is a block diagram of a photolithography system for implementing various embodiments of the present invention.

With reference now to FIG. 1, a maskless photolithography system 30, as described in presently incorporated U.S. Pat. Ser. No. 09/480,796, includes a light source 32, a first lens system 34, a computer aided pattern design system 36, a pixel panel 38, a panel alignment stage 39, a second lens system 40, a subject 42, and a subject stage 44. A resist layer or coating 46 may be disposed on the subject 42. The light source 32 is an incoherent light source (e.g., a Mercury lamp) that provides a collimated beam of light 48 which is projected upon the first lens system 34 and onto the pixel panel 38.

The pixel panel 38 is provided with digital data via suitable signal line(s) 37 from the computer aided pattern design system 36 to create a desired pixel pattern (the pixel-mask pattern). The pixel-mask pattern may be available and resident at the pixel panel 38 for a desired, specific duration. Light emanating from (or through) the pixel-mask pattern of the pixel panel 38 then passes through the second lens system 40 and onto the subject 42. In this manner, the pixel-mask pattern is projected onto the resist coating 46 of the subject 42.

In some embodiments, it may be desired to either increase the size of the site being exposed, or to increase the resolution of the site (or both). If the pixel panel 38 is a digital light processor (DLP) or digital mirror device (DMD) such as is illustrated in U.S. Pat. No. 5,079,544 and patents referenced therein, current technology provides a 600×800 array of mirrors for a set of potential pixel elements. Each mirror provides a pixel that is about 17 microns in size.

Figure 2:
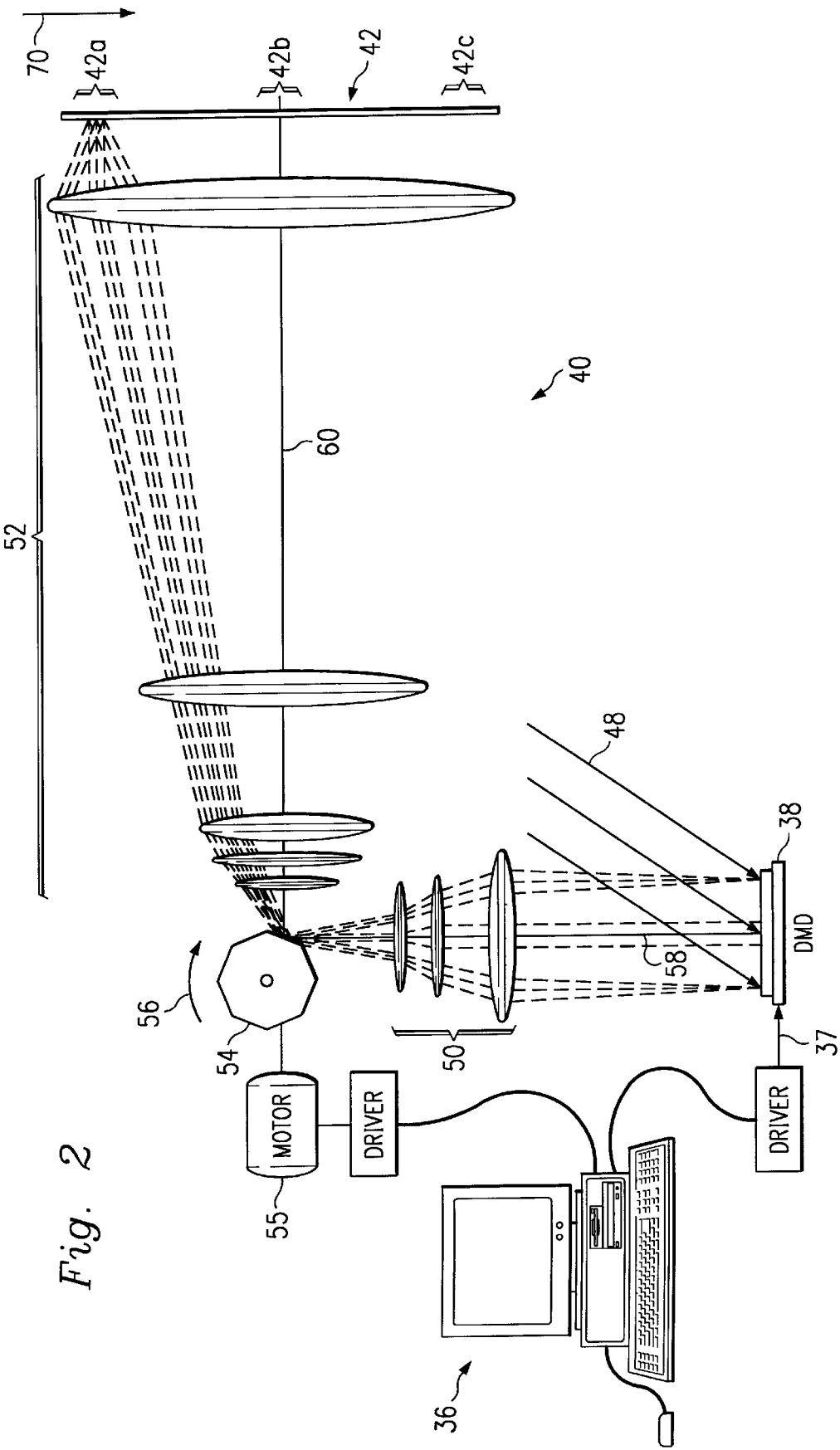
FIG. 2 illustrates one embodiment of a pixel panel and a lens system for use in the photolithography system of FIG. 1.

Referring now to FIG. 2, in one embodiment, the second lens system 40 includes a pair of F-θ lenses 50 and 52. An F-θ lens is one that satisfies the equation:

$$y=f\theta,$$

where y represents the distance from an optical axis of the lens to a beam spot on a image formation surface to be scanned, f represents the focal length of the F-θ lens, and θ represents the angle of incidence of the beam upon the lens.

Positioned between the two F-θ lenses 50, 52 is a multi-faceted mirror 54. The mirror 54 is rotatable (e.g., by a motor 55), as indicated by a direction arrow 56, so that each facet of the mirror sequentially aligns with a first axis 58 with a second axis 60. In the present embodiment, the first axis 58 perpendicularly extends from a central point of the DMD 38 and the second axis perpendicularly extends from a central point of the subject 42.

The computer aided mask design system 36 can be used for the creation of the digital data for the pixel-mask pattern. The computer aided pattern design system 36 may include computer aided design (CAD) software similar to that which is currently used for the creation of mask data for use in the manufacture of a conventional printed mask. Any modifications and/or changes required in the pixel-mask pattern can be made using the computer aided pattern design system 36. Therefore, any given pixel-mask pattern can be changed, as needed, almost instantly with the use of an appropriate instruction from the computer aided pattern design system 36. The computer aided mask design system 36 can also be used for adjusting a scale of the pattern or for correcting image distortion in the pattern. For example, the pattern can be modified as it is provided to the DMD 38, discussed in greater detail below, to account for any distortion at the edges of the subject 42.

In operation, the DMD 38 projects the pixel-mask pattern through the first F-θ lens system 50 and onto the faceted mirror 54. The pattern reflects off one of the facets of the mirror 54, through the second F-θ lens system 52, and onto the subject 42. Since the mirror 54 is rotating, the reflected pattern actually moves to different portions of the subject 42. For example, when the mirror 54 is at a position as illustrated in FIG. 2, the pattern is projected to an upper portion 42a of the subject 42. But as the mirror 54 rotates in the direction 56, the pattern moves along the subject 42 in a direction 70. Eventually, the pattern is "image scanned" to include a central portion 42b and a lower portion 42c of the subject.

Figure 3:
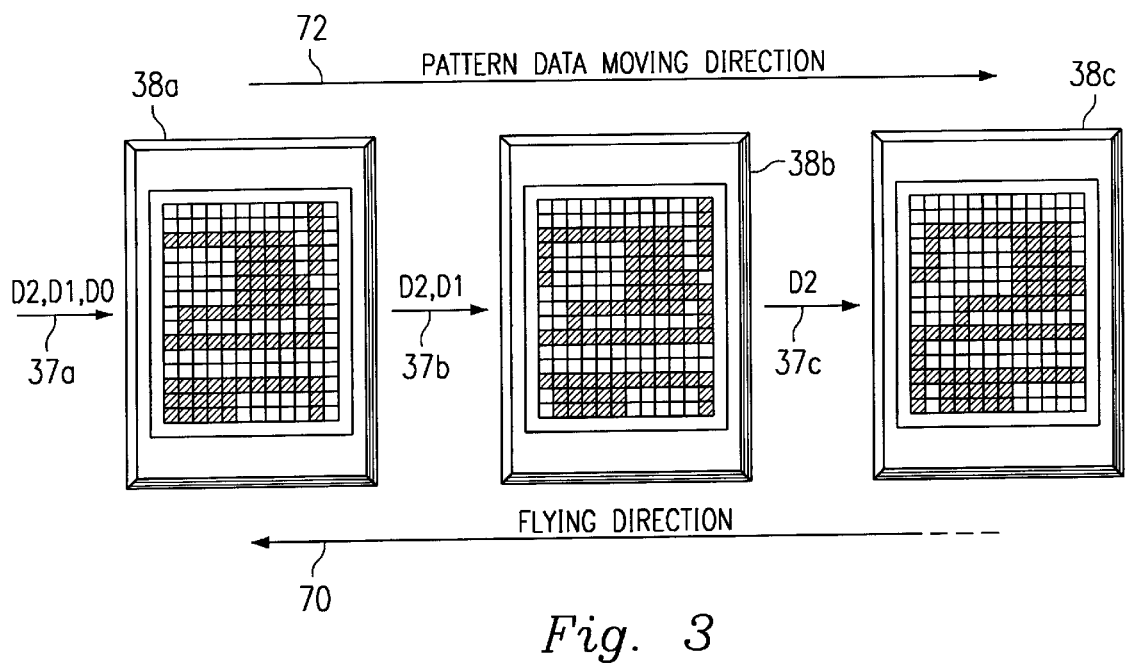
FIG. 3 illustrates a pixel pattern moving across the pixel panel of FIG. 2.

Referring also to FIG. 3, corresponding to the image scanning described above, the pixel-mask pattern being projected by the DMD 38 changes accordingly. This correspondence can be provided, in one embodiment, by having the computer system 36 control both the motor 55 and the data provided to the DMD 38. The illustrations of FIG. 3 and following discussions describe how the data can be timely provided to the DMD 38.

FIG. 3 shows three intermediate images of the DMD 38 and the signal lines 37, each with a suffix "a", "b", or "c". The signals 37a, 37b, 37c and DMDs 38a, 38b, 38c correspond to the portions 42a, 42b, 42c, respectively. The portions 42a, 42b, 42c are identified by precise movement of the motor 55, and hence the mirror 54. It is understood that the illustrated spacing between the portions 42a, 42b, 42c is exaggerated for the sake of clarity, and since the pattern is image scanned, some overlapping between portions will actually occur.

In the first intermediate image, the pattern of DMD 38a is created responsive to receiving data D0 provided through the signal lines 37a. In the present example, the pattern is created as a matrix of pixel elements in the DMD 38a. After a predetermined period of time (e.g., due to exposure considerations being met), the pattern is shifted. The shifted pattern (now shown as DMD 38b) includes additional data D1 provided through the signal lines 38b. In the second intermediate image of FIG. 3, D1 represents the left-most column of pixel elements in the pattern of DMD38b. After another predetermined period of time, the pattern (now shown as DMD 38c) is shifted again. The twice-shifted pattern includes additional data D2 provided through the signal lines 38b. In the third intermediate image of FIG. 3, D2 now represents the left-most column of pixel elements in the pattern of the DMD38c. Thus, the pattern moves across the DMD 38 in a direction 72. It is noted that the pattern direction 72, as it is being provided to the DMD 38 from the signal lines 37, is moving opposite to the scanning direction 70.

Figure 4:
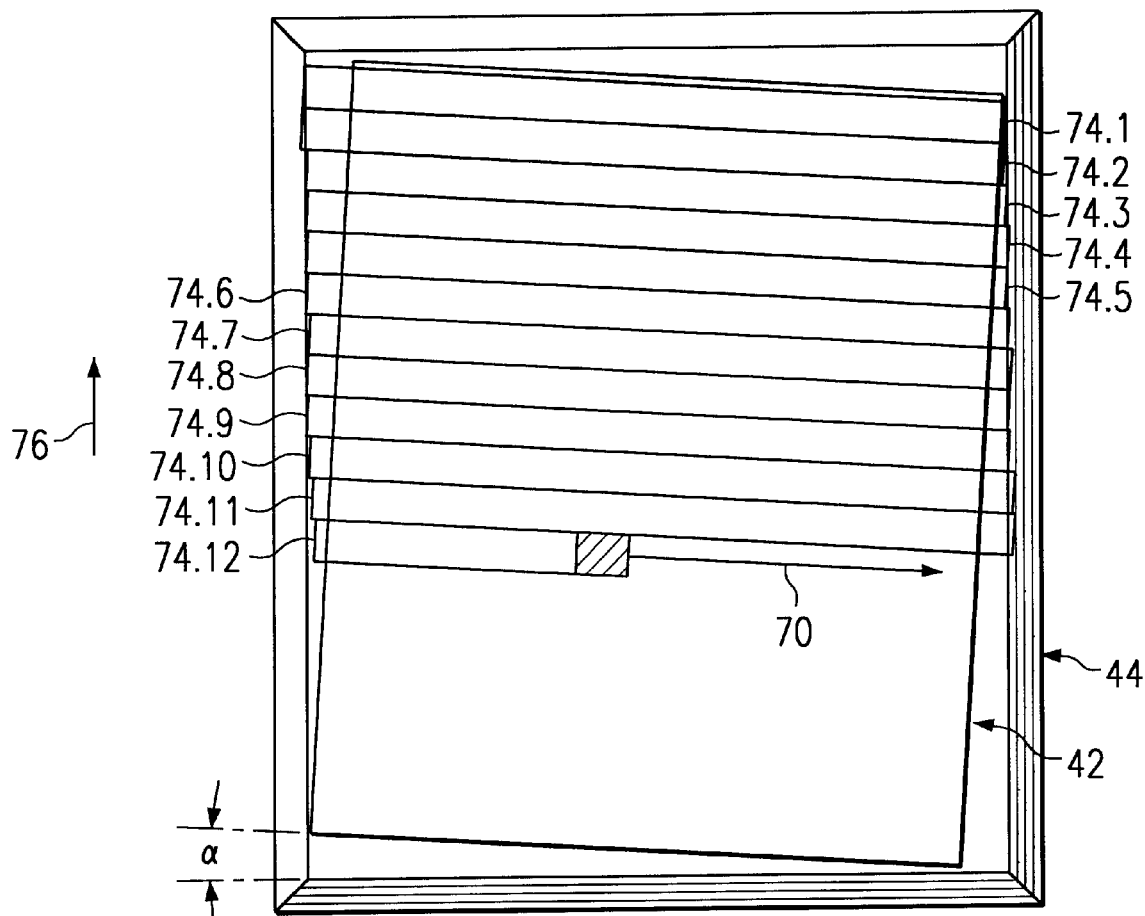
FIG. 4 illustrates a subject being image scanned by the pixel panel and lens system of FIG. 2.

Referring also to FIG. 4, the subject 42 and the alignment stage 44 are illustrated as rectangular in shape to better describe the following aspects of the present embodiment. It is understood, however, that many different shaped subjects, including flat wafers or three-dimensional non-planar substrates, may benefit from the present invention. In FIG. 4, a first image scan 74.1 is produced on the subject 42. Additional image scans 74.2–74.12 can be produced by moving the subject 42 (e.g., by movement of the stage 44) in a direction 76. This movement 76 can be performed as a step function, or as a linear function.

FIG. 4 illustrates an example of linear movement 76. Since the movement is linear, the subject 42 is constantly moving in the direction 76. As a result, the image scans 74.1–74.12 appear slanted, when compared to the stage 44. To offset this slanting, the subject 42 may be rotated at an angle a on the stage 44. This produces straight image scans 74.1–74.12, as seen by the subject 42.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A system for image-scanning a pixel-mask pattern onto a subject, the system comprising:
   a panel for generating a pattern comprising a plurality of pixel elements, each pixel element being of a potential on or off state independent of any other pixel element;
   a lens system positioned between the panel and the subject for simultaneously directing the pixel elements to the subject;
   a mirror positioned between the panel and the subject for directing the pixel elements to a portion of the subject at any one time; and
   means for moving the mirror to scan the pixel elements across the subject, the moving means scanning at a rate whereby at least two pixel elements overlap the same portion of the subject.

2. The system of claim 1 further comprising:

means for moving the subject to further scan the pattern across the subject.

3. The system of claim 1 further comprising:

means for sequentially and selectively providing the pixel elements to the panel so that the pixel elements of the pattern can move in conjunction with the movement of the mirror.

4. The system of claim 1 wherein the lens system includes at least one F-θ lens.

5. The system of claim 1 wherein the panel is a digital mirror device.

6. The system of claim 1 wherein the panel is a liquid crystal display.

7. The system of claim 1 further comprising:

a non-coherent light source for projecting the pattern using the panel.

8. The system of claim 1 further comprising:

a computing system for generating the pixel elements and providing the pixel elements to the panel in a predetermined sequence.

9. The system of claim 8 wherein the computing system is also used for designing the pattern.

10. The system of claim 8 wherein the computing system is also used for adjusting a scale of the pattern.

11. The system of claim 8 wherein the computing system is also used for correcting image distortion in the pattern.

* * * * *